US 8,884,682 B2

(12) United States Patent
Nakahara et al.

(10) Patent No.: US 8,884,682 B2
(45) Date of Patent: Nov. 11, 2014

(54) POWER SEMICONDUCTOR DEVICE

(75) Inventors: Akihiro Nakahara, Kanagawa (JP); Sakae Nakajima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/009,380

(22) PCT Filed: Mar. 28, 2012

(86) PCT No.: PCT/JP2012/058207
§ 371 (c)(1),
(2), (4) Date: Oct. 2, 2013

(87) PCT Pub. No.: WO2012/137651
PCT Pub. Date: Oct. 11, 2012

(65) Prior Publication Data
US 2014/0022001 A1    Jan. 23, 2014

(30) Foreign Application Priority Data

Apr. 4, 2011   (JP) .................................. 2011-082518

(51) Int. Cl.
| H03K 17/16 | (2006.01) |
| H03K 17/082 | (2006.01) |
| H03K 17/081 | (2006.01) |
| H01L 27/07 | (2006.01) |
| H01L 27/088 | (2006.01) |
| H01L 29/78 | (2006.01) |

(52) U.S. Cl.
CPC ............ H03K 17/081 (2013.01); H03K 17/161 (2013.01); *H01L 29/7813* (2013.01); H03K 17/0822 (2013.01); H01L 27/0716 (2013.01); *H01L 29/7835* (2013.01); H01L 27/088 (2013.01)
USPC ............ 327/380; 327/434; 327/108; 327/374

(58) Field of Classification Search
USPC ......................................................... 327/380
See application file for complete search history.

(56) References Cited

U.S. PATENT DOCUMENTS

| 5,276,370 A | 1/1994 | Nishiura et al. |
| 6,426,653 B1 * | 7/2002 | Baker ............................ 326/83 |

(Continued)

FOREIGN PATENT DOCUMENTS

| JP | 04-364784 A | 12/1992 |
| JP | 08-288817 A | 11/1996 |

(Continued)

OTHER PUBLICATIONS

International Preliminary Report on Patentability received in International Application No. PCT/JP2012/058207 dated May 22, 2010.

*Primary Examiner* — Lincoln Donovan
*Assistant Examiner* — Patrick Chen
(74) *Attorney, Agent, or Firm* — Mattingly & Malur, PC

(57) ABSTRACT

A power semiconductor device includes an output transistor, a control circuit connected with a gate of the output transistor, a first discharge route from a first node to a ground terminal, and a second discharge route from the first node to the ground terminal. In a usual turn-off, only the first discharge route is used. When a load abnormality occurs, both of the first and second discharge routes are used. The second discharge route contains a discharge transistor and a countercurrent prevention device. The discharge transistor is connected between the first node and the second node. The countercurrent prevention device prevents a flow of current from the third node to the second node. At least, in an OFF period, the control circuit sets the gate voltage of the discharge transistor to a high level.

6 Claims, 13 Drawing Sheets

(56) References Cited

U.S. PATENT DOCUMENTS

| | | | |
|---|---|---|---|
| 8,299,841 B2 * | 10/2012 | Fukuhara et al. | 327/427 |
| 2005/0068705 A1 | 3/2005 | Nakahara | |
| 2007/0170978 A1 * | 7/2007 | Furuichi et al. | 327/530 |
| 2008/0170345 A1 | 7/2008 | Tanabe | |
| 2009/0153225 A1 | 6/2009 | Nakahara | |
| 2012/0032707 A1 | 2/2012 | Nakahara | |

FOREIGN PATENT DOCUMENTS

| | | |
|---|---|---|
| JP | 2002-076865 A | 3/2002 |
| JP | 2002-084174 A | 3/2002 |
| JP | 2005-109162 A | 4/2005 |
| JP | 2008-172940 A | 7/2008 |
| JP | 2009-165113 A | 7/2009 |

* cited by examiner

Fig. 11

| PWR | ND | NB | N3 |
|---|---|---|---|
| L | H(VCC) | H(VCC) | H(VCC) |
| H (LOAD NORMAL) | H(VCC) | L(VCC-6V) | L(VCC-6V) |
| H (LOAD ABNORMAL) | L(VCC-6V) | H(VCC) | L(VCC-6V) |

130

POWER SEMICONDUCTOR DEVICE

TECHNICAL FIELD

The present invention is related to a power semiconductor device.

BACKGROUND ART

A power semiconductor device to supply power to a load is known. The power semiconductor device called an intelligent power device (IPD) is used in an electronic control system of a car to control supply of power to a headlight and so on according to an instruction from a microcomputer. In such a power semiconductor device, generally, a high side switch is used (For example, Patent Literature 1).

FIG. 1 shows a configuration of the power semiconductor device described to Patent Literature 1. The power semiconductor device has a power supply terminal TV, an output terminal TO, an output transistor 210, a control circuit 220, a resistance 230, a discharge transistor 240 and a zener diode 250. A power supply voltage VCC is supplied to the power supply terminal TV.

The output transistor 210 is connected between the power supply terminal TV and the output terminal TO. In detail, the output transistor 210 is an N-channel MOSFET, and its gate, drain and source are connected with a node N1, the power supply terminal TV and the output terminal TO, respectively. The output terminal TO is connected with one end of a load and the other end of the load is connected with a ground terminal. Thus, the output transistor 10 is connected to function as a high side switch.

The resistance 230 is connected between the node N1 and the output terminal TO. The discharge transistor 240 is an N-channel MOSFET, and its gate, back gate, drain and source are connected with a node NB, a node NC, the node N1 and a node N2, respectively. The node NC (back gate) and the node N2 (source) are short-circuited. An anode and cathode of the zener diode 250 are connected with the node N2 and the ground terminal TG, respectively. The route from the node N1 to the ground terminal TG through the discharge transistor 240 and the zener diode 250 is a discharge route for the node N1.

The control circuit 220 controls the charging and discharging operations of the node N1 connected with the gate of the output transistor 210. In detail, in case of power-on, the control circuit 220 sets a voltage of the node NB to a low level so as to turn off the discharge transistor 240. Thus, the discharge route which goes through the discharge transistor 240 is deactivated. On the other hand, the control circuit 220 charges the node N1 to turn on the output transistor 210. Thus, the power is supplied to the load connected with the output terminal TO.

In case of power-off, the control circuit 220 stops the charging to the node N1. Also, the control circuit 220 sets a voltage of the node NB to a high level, to turn on the discharge transistor 240. Thus, a current flows from the node N1 to the ground terminal TG through the discharge transistor 240 and the zener diode 250, so as to discharge from the node N1. At the same time, a current flows from the node N1 to the output terminal TO through the resistance 230 so as to discharge from the node N1. Therefore, the node N1 is discharged rapidly and the voltage at the node N1 reduces rapidly. As a result, the output transistor 210 is turned off quickly.

CITATION LIST

[Patent literature 1] JP H04-364784A

SUMMARY OF THE INVENTION

In recent years, there are various requests to the power semiconductor device as shown in FIG. 1. For example, in case of usual power-off, it is requested to turn off the output transistor 210 slowly for the purpose of noise reduction. On the other hand, when an abnormality has occurred in the load in the midst of the power-on (for example, when a short-circuit is generated in the load so that the over-current flows), the output transistor 210 is turned off at high speed so as not to avoid destruction of the transistor 210, because excessive power is applied to the output transistor 210. That is, as a method of discharging from the node N1, there is a case where two patterns of a "low-speed discharge" and a "high-speed discharge" are required. If the two patterns are realized, the circuit configuration shown in FIG. 1 is as follows.

In case of the usual power-off, the "low-speed discharge" is carried out to reduce noise. Specifically, the control circuit 220 stops the charging of the node N1. Also, the control circuit 220 sets the voltage of the node NB to the low level to turn off the discharge transistor 240. Thus, a high-speed discharge route is deactivated from the node N1 to the ground terminal TG through the discharge transistor 240 and the zener diode 250. Charge of the node N1 is discharged through the low-speed discharge route passing through the resistance 230. As a result, the output transistor 210 is slowly turned off.

On the other hand, when the load abnormality has occurred in the midst of the power-on, the "high-speed discharge" is carried out to prevent the destruction of the output transistor 210. Specifically, the control circuit 220 stops the charging of the node N1. Also, the control circuit 220 sets the voltage of the node NB to a high level to turn on the discharge transistor 240. Thus, the high-speed discharge route is activated from the node N1 to the ground terminal TG through the discharge transistor 240 and the zener diode 250. At the same time, a current flows from the node N1 to the output terminal TO through the resistance 230. Therefore, the discharge is carried out rapidly from the node N1, and as a result, the output transistor 210 is turned off at high speed.

Here, inventors of the present invention discovered the following problem. It is a fact that there is a possibility that the output transistor 210 is destroyed in heat with a surge voltage applied externally, when the above power semiconductor device is formed on a single semiconductor substrate. This problem will be described below.

In the above power semiconductor device, it is desirable that the ON resistance of the output transistor 210 (a power MOSFET) is sufficiently low. For this reason, it is required to apply a sufficiently high drive voltage to the node N1 connected with the gate of the output transistor 210. In this way, a high breakdown voltage MOSFET is generally used as the discharge transistor 240 because the high voltage is applied to the node N1. FIG. 2 shows a sectional structure of an example of the output transistor 210 and the discharge transistor 240. The discharge transistor 240 has a high breakdown voltage MOSFET structure.

The discharge transistor 240 has a parasitic bipolar transistor of a vertical type, as shown in FIG. 2. FIG. 3 shows the circuit configuration, including the parasitic bipolar transistor. As shown in FIG. 3, a drain and a back gate of the discharge transistor 240 are connected with the node N1 and the node NC, respectively. A collector, emitter and base of the parasitic bipolar transistor Q1 are connected with the power supply terminal TV, the node N1 and the node NC, respectively. Also, a parasitic capacitance (capacitance between the collector and the base) C1 is generated between the power supply terminal TV and the node NC.

A case where the steep increase of the power supply voltage VCC has occurred when the power semiconductor device (the output transistor 210) is in a turn-off condition will be considered. Because the zener diode 250 is provided between the node NC and the ground terminal TG, the node NC (the back gate of the discharge transistor 240) is set to high impedance in the turn-off condition. Therefore, when the steep increase of the power supply voltage VCC occurs, the voltage of the node NC (the base voltage of the parasitic bipolar transistor Q1) is raised through the parasitic capacitance C1. As a result, the parasitic bipolar transistor Q1 is turned on. At this time, if the voltage VCE between the collector and the emitter exceeds a breakdown voltage BVCEO, a large breakdown current flows. Here, FIG. 4 shows a current-to-voltage characteristic of the parasitic bipolar transistor Q1. When the voltage VCE between the collector and the emitter exceeds the breakdown voltage BVCEO, it could be seen that a large breakdown current flows.

Because the voltage of the node N1 connected with the gate of the output transistor 210 is raised due to this breakdown current, the output transistor 210 is turned on. However, at this time, the output transistor 210 is turned on in a high ON resistance (half turn-on). In this case, because excessive power is applied to the output transistor 210, there is a possibility that the heat destruction occurs.

For example, the power supply terminal TV of the power semiconductor device installed in a car is connected with a battery. As an example of the steep increase of the power supply voltage VCC in this case, a "dump surge" is considered as shown in FIG. 5. The dump surge is a surge generated in the power supply terminal TV when the battery comes off during the generation of AC power. When the dump surge is applied to the power supply terminal TV, there is a possibility that the parasitic bipolar transistor Q1 operates for the above-mentioned reason so that the heat destruction of the output transistor 210 occurs.

As described above, there is a possibility that the heat destruction of the output transistor 210 caused by half turn-on occurs if the steep increase of the power supply voltage occurs when the power semiconductor device is in the turn-off condition. A technique is demanded which can prevent that the output transistor is turned on, even if the steep increase of the power supply voltage VCC occurs.

In one aspect of the present invention, a power semiconductor device is provided. The power semiconductor device includes an output transistor connected between a power supply terminal and an output terminal; a control circuit configured to control a charging operation and a discharging operation of a first node connected with a gate of the output transistor and to control ON/OFF conditions of the output transistor; a first discharge route from the first node to the output terminal; and a second discharge route from the first node to the ground terminal.

Here, an ON period is a period during which the output transistor is in an ON condition stably after the first node is charged. An OFF period is a period during which the output transistor is in an OFF condition stably after discharge from the first node is carried out. A transition period from the OFF period to the ON period is a turn-on period. A transition period from the ON period to the OFF period is a turn-off period.

In the turn-on period and the ON period, the control circuit charges the first node, and deactivates the first discharge route and the second discharge route. In the turn-off period and the OFF period, the control circuit deactivates the second discharge route and activates the first discharge route so that the discharge from the first node is carried out through the first discharge route. When the load abnormality has occurred, the control circuit activates both of the first discharge route and the second discharge route so that the discharging from the first node is carried out through both of the first discharge route and the second discharge route.

The second discharge route includes a discharge transistor and a countercurrent prevention device. A drain of the discharge transistor is connected with the first node, and a source and a back gate of the transistor are connected are connected with a second node. The countercurrent prevention device is connected between the second node and a third node to prevent a flow of current from the third node to the second node. When the load abnormality has occurred, the control circuit turns on the discharge transistor. Moreover, the control circuit sets the gate voltage of the discharge transistor to the high level, in the OFF period at least.

According to the present invention, even if the steep increase of the power supply voltage has occurred when the power semiconductor device is in the OFF condition, it becomes possible to prevent the output transistor from being turned on.

BRIEF DESCRIPTION OF THE DRAWINGS

The above and other objects, the merits, and the characteristics will be made clear from the embodiments of the present invention which will be described with reference to the following drawings:

FIG. 11 shows a truth table in a circuit shown in FIG. 10;

DESCRIPTION OF EMBODIMENTS

A power semiconductor device according to embodiments of the present invention will be described with reference to the attached drawings.

1. Configuration

Figure 6:
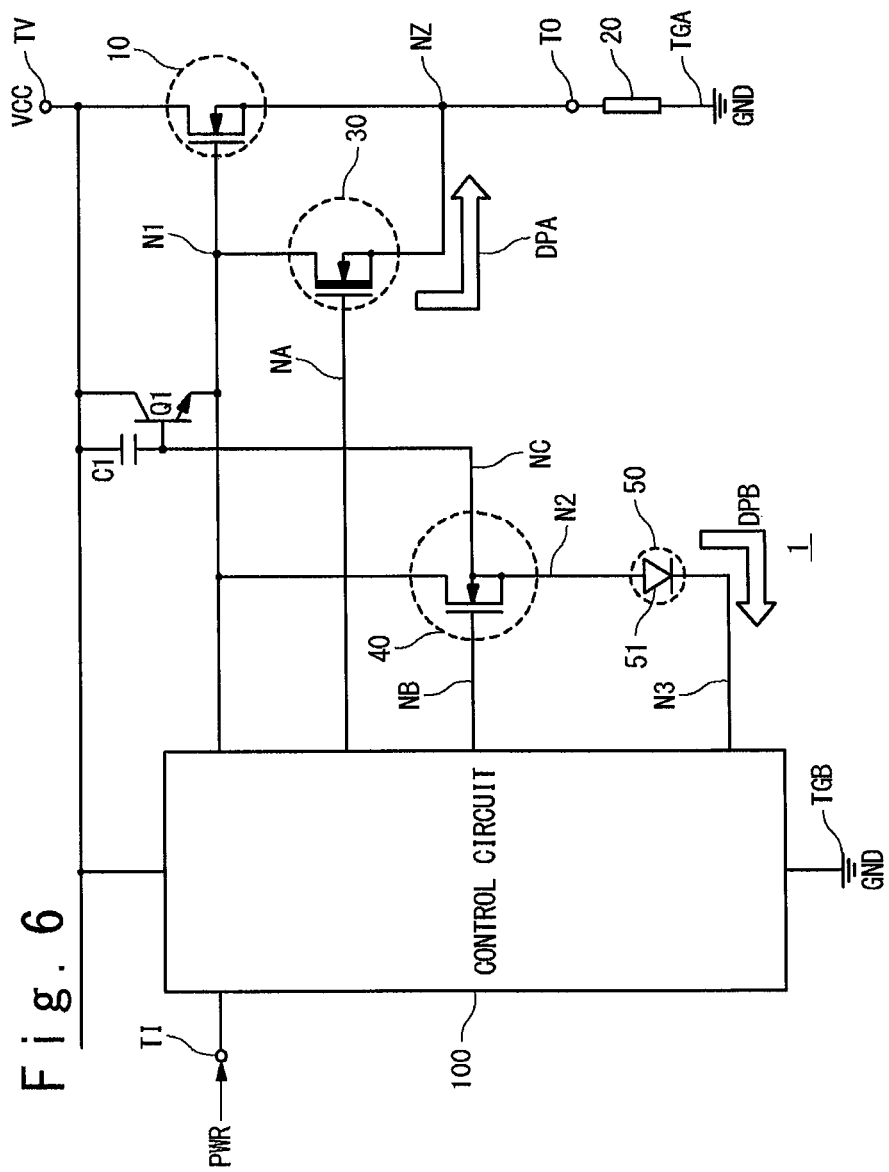
FIG. 6 is a block diagram showing a configuration of a power semiconductor device according to an embodiment of the present invention.

FIG. 6 is a block diagram schematically showing a configuration of a power semiconductor device 1 according to an embodiment of the present invention. The power semiconductor device 1 has a power supply terminal TV, an input terminal TI and an output terminal TO. The output terminal TO is connected with one end of a load 20, and the other end of the load 20 is connected with a ground terminal TGA. A power supply voltage VCC is supplied to the power supply terminal TV. A power-on signal PWR is supplied to the input terminal TI. The power semiconductor device 1 is turned on in response to an activation of the power-on signal PWR, to supply the power to the load 20 through the output terminal TO.

In detail, the power semiconductor device 1 has an output transistor 10, a first discharge route DPA, a second discharge route DPB and a control circuit 100.

The output transistor 10 is connected between the power supply terminal TV and the output terminal TO. Specifically, the output transistor 10 is an N-channel MOSFET, and a gate, a drain and a source are respectively connected with a first node N1, the power supply terminal TV and the output terminal TO (the output node NZ). It should be noted that the output node NZ is the same as the output terminal TO in potential, and is handled as it is equivalent to the output terminal TO.

The first discharge route DPA is a low-speed discharge route to slowly discharge from the first node N1 and is connected from the first node N1 to the output node NZ. In other words, the first discharge route DPA connects between the gate and the source of the output transistor 10. The first discharge route DPA contains a first discharge transistor 30. The first discharge transistor 30 is an N-channel MOSFET, and a gate, a drain and a source are connected with a first gate node NA, the first node N1 and the output node NZ, respectively. The condition that the first discharge transistor 30 is turned on is in the condition that the first discharge route DPA is activated. On the other hand, the condition that the first discharge transistor 30 is turned off is in the condition that the first discharge route DPA is deactivated.

For example, as the first discharge transistor 30, a depletion-type MOSFET having a constant current characteristic is suitably used. However, the first discharge transistor 30 may be an enhancement-type MOSFET. Or, a resistance may be used instead of the first discharge transistor 30. In the following description, the first discharge transistor 30 is the depletion-type N-channel MOSFET.

The second discharge route DPB is a high-speed discharge route to discharge from the first node N1 at high speed and connects from the first node N1 to the ground terminal TGB. It should be noted that the ground terminal TGB is different from the ground terminal TGA on the side of load 20. The second discharge route DPB contains a second discharge transistor 40 and a countercurrent preventing device 50.

The second discharge transistor 40 is an N-channel MOSFET, and a gate, a back gate, a drain and a source are connected with a second gate node NB, a back gate node NC, the first node N1 and the second node N2, respectively. A short-circuit is formed between the back gate node NC (the back gate) and the second node N2 (the source). The condition in which the second discharge transistor 40 is turned on is in the condition in which the second discharge route DPB is activated. On the other hand, the condition in which the second discharge transistor 40 is turned off is in the condition in which the second discharge route DPB is deactivated. In the following description, it is supposed that the second discharge transistor 40 is the enhancement-type N-channel MOSFET.

Figure 1:
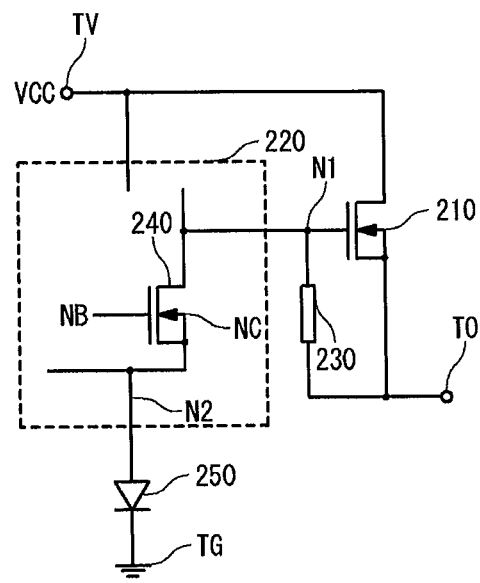
FIG. 1 is a circuit diagram schematically showing a configuration of a power semiconductor device according to a related technique.
Figure 2:
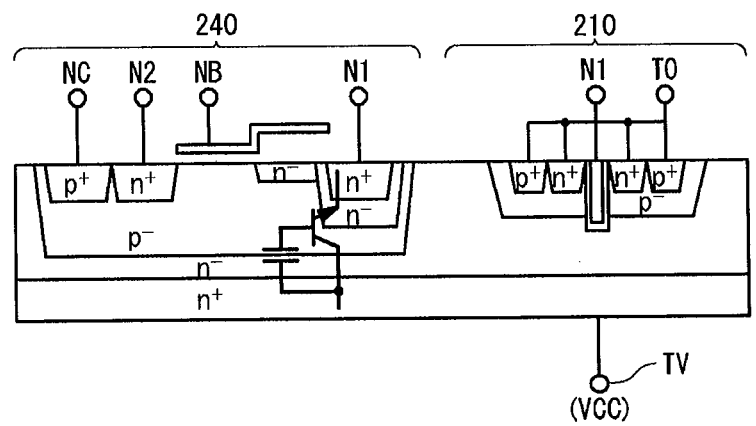
FIG. 2 is a sectional view schematically showing a typical sectional structure of an output transistor and a discharge transistor.
Figure 3:
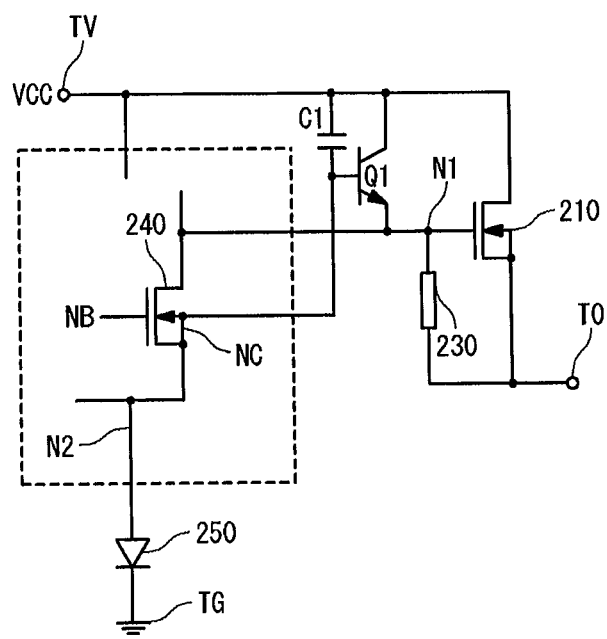
FIG. 3 is an equivalent circuit diagram schematically showing the configuration of the power semiconductor device which includes a parasitic bipolar transistor.
Figure 4:
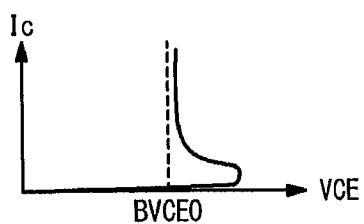
FIG. 4 is a graph showing a current-to-voltage characteristic of the parasitic bipolar transistor.
Figure 5:
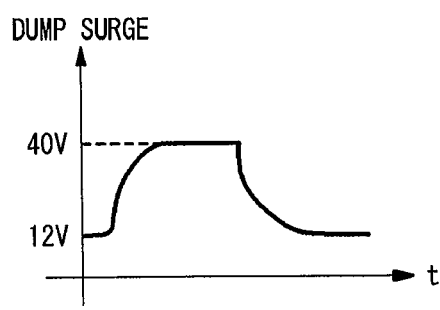
FIG. 5 is a conceptual diagram showing a dump surge applied to a power supply terminal of the power semiconductor device which is installed in a car.

Also, in the present embodiment, the high breakdown voltage MOSFET as shown in FIG. 2 is used as the second discharge transistor 40. Therefore, the second discharge transistor 40 has a parasitic bipolar transistor Q1. As shown in FIG. 6, a collector, an emitter and a base of the parasitic bipolar transistor Q1 are connected with the power supply terminal TV, the first node N1 and the back gate node NC, respectively. Also, the parasitic capacitance (the capacitance between the collector and the base) C1 is connected between the power supply terminal TV and the back gate node NC.

The countercurrent prevention device 50 is provided to prevent a current from flowing from the ground terminal TGB to the ground terminal TGA on the side of load 20 when a difference is generated in the ground voltage between the ground terminal TGB and the ground terminal TGA on the side of load 20. The countercurrent prevention device 50 is provided on the side of the ground rather than the second discharge transistor 40. Specifically, the countercurrent prevention device 50 is connected between the above-mentioned second node N2 and a third node N3 on the side of the ground terminal TGB to prevent the flow of a current from the third node N3 to the second node N2. For example, a diode 51 is used as the countercurrent prevention device 50 as shown in FIG. 6. The anode and cathode of the diode 51 are connected with the second node N2 and the third node N3, respectively.

The control circuit 100 is connected with the input terminal TI, the power supply terminal TV, the ground terminal TGB, the first node N1, the first gate node NA, the second gate node NB and the third node N3. The control circuit 100 controls the charging and discharging operations of the first node N1 according to a power-on signal PWR supplied to the input terminal TI and controls ON/OFF of the output transistor 10. For example, when the power-on signal PWR is activated, the control circuit 100 charges the first node N1 to a high voltage which is higher than the power supply voltage VCC. As a result, the output transistor 10 is turned on and the power is supplied to the load 20.

On the other hand, when the output transistor 10 is turned off, the control circuit 100 discharge from the first node N1 appropriately according to the situation by using the first discharge route DPA and the second discharge route DPB. Therefore, the control circuit 100 controls the voltages of the first gate node NA, the second gate node NB and the third node N3 according to the situation. The control circuit 100 can control the activation/deactivation of the first discharge route DPA (ON/OFF of the first discharge transistor 30) by controlling the voltage of the first gate node NA. Also, the control circuit 100 can control the activation/deactivation of the second discharge route DPB (ON/OFF of the second discharge transistor 40) by controlling the voltage of the second gate node NB and the third node N3.

Hereinafter, the operation of the power semiconductor device 1 according to the present embodiment will be described in detail.

2. Operation

Figure 7:
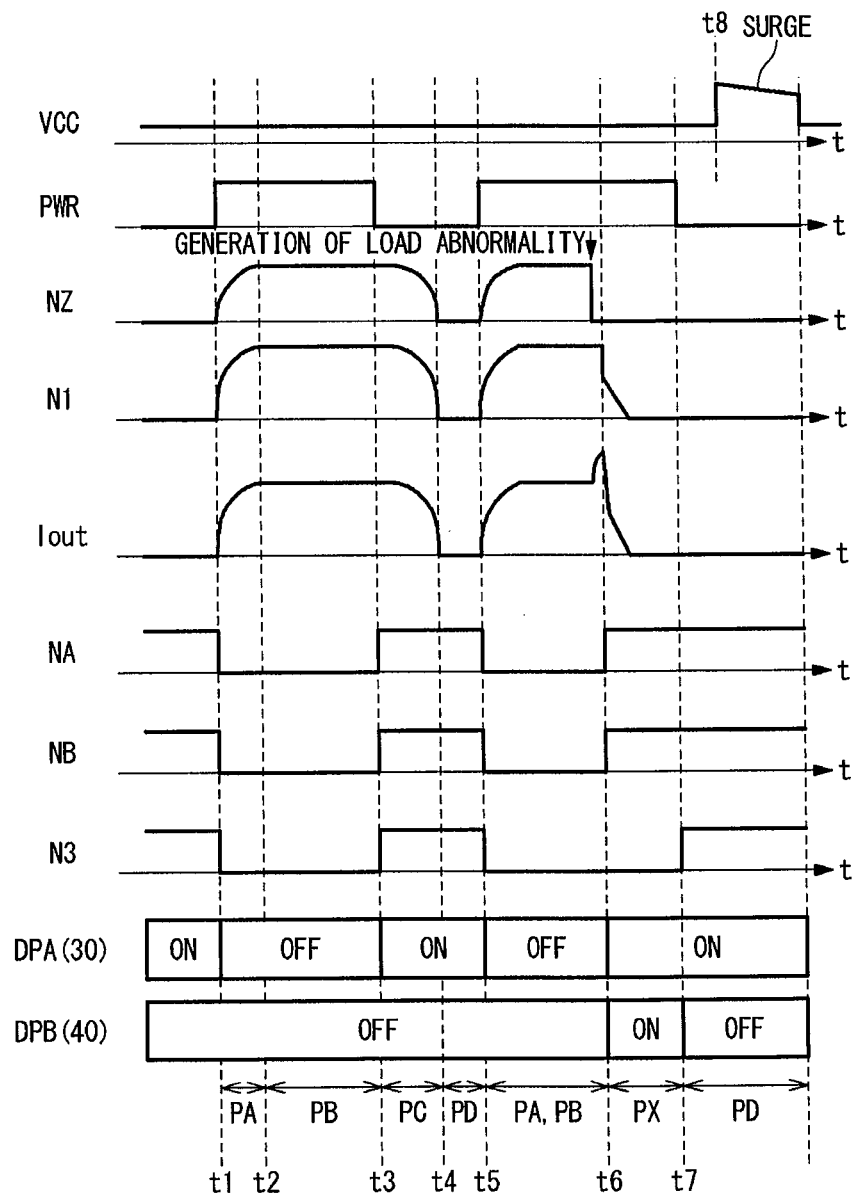
FIG. 7 is a timing chart showing an operation of the power semiconductor device according to the embodiment of the present invention.

FIG. 7 is a timing chart showing the operation of the power semiconductor device 1 according to the present embodiment. Hereinafter, the basic operation of the power semiconductor device 1 will be described with reference to FIG. 6 and FIG. 7. In the description of the operation, four periods (phases), that is, a turn-on period PA, an ON period PB, a turn-off period PC, and an OFF period PD are considered.

The turn-on period PA and the ON period PB are periods during which the power-on signal PWR is activated (PWR=high level). When the power-on signal PWR is activated, the first node N1 is charged, the output transistor 10 is turned on and the output node NZ is charged. The ON period PB is a period during which the voltages of the first node N1 and the output node NZ are stable and the output transistor 10 is stably in the ON state. On the other hand, the turn-on period PA is a period from the activation timing of the power-on signal PWR to the ON period PB. In other words, the turn-on period PA is a transition period from the OFF period PD to the ON period PB.

The turn-off period PC and the OFF period PD are periods during which the power-on signal PWR is in a deactivated state (PWR=low level). The discharge from the first node N1 is carried out, the output transistor 10 is turned off and the discharge from the output node NZ is carried out, when the power-on signal PWR is deactivated. The OFF period PD is a period during which the voltages of the first node N1 and the output node NZ are stable and the output transistor 10 is stably in the OFF condition. On the other hand, the turn-off period PC is a period from the deactivation timing of the power-on signal PWR to the OFF period PD. In other words, the turn-off period PC is a transition period from the ON period PB to the OFF period PD.

2-1. Turn-On Period PA (Time t1 to t2)

At time t1, the power-on signal PWR is activated and changes from a low level to a high level. In response to the change, the control circuit 100 starts charging the first node N1.

On the other hand, the control circuit 100 sets the voltage of the first gate node NA to the low level. The voltage in the low level of first gate node NA is less than the voltage of the output node NZ, e.g. "the voltage of the output node NZ−3 (V)". Thus, the gate voltage of the first discharge transistor 30 becomes less than the source voltage, so that the first discharge transistor 30 is turned off and the first discharge route DPA is deactivated.

Also, the control circuit 100 sets the voltages of the second gate node NB and the third node N3 to the low level. The voltages in the low level of the second gate node NB and the third node N3 are less than the power supply voltage VCC, e.g. "VCC−6 (V)". Thus, the voltage (=0 (V)) between the gate and the source in the second discharge transistor 40 become less than a threshold voltage so that the second discharge transistor 40 is turned off and the second discharge route DPB is deactivated.

In this way, in the turn-on period PA, the control circuit 100 charges the first node N1 and deactivates the first discharge route DPA and the second discharge route DPB. As a result, the output transistor 10 is turned on and the voltage of the output node NZ and the output current Iout are raised gradually. It should be noted that in the turn-on period PA, the first node N1 is charged to a higher voltage than the power supply voltage VCC.

2-2. ON Period PB (Time t2 to t3)

The control in the ON period PB is same as in the case of the turn-on period PA. The voltage of the first node N1 is stable in the higher voltage than the power supply voltage VCC. The voltage of the output node NZ is stabilized in the neighborhood of the power supply voltage VCC. The output transistor 10 is in the turned on state stably.

2-3. Turn-Off Period PC (Time t3 to t4)

The power-on signal PWR is deactivated at time t3 and changes from the high level to the low level. In response to the deactivation, the control circuit 100 stops the charging the first node N1.

On the other hand, the control circuit 100 sets the first gate node NA to the voltage in the high level. For example, the voltage of the first gate node NA in the high level is a voltage of the output node NZ. Thus, the first discharge transistor 30 (the depletion-type MOSFET) is turned on and the first discharge route DPA is activated.

Also, the control circuit 100 sets the second gate node NB and the third node N3 to the voltages in the high level. For example, the voltages of the second gate node NB and the third node N3 in the high level are the power supply voltage VCC. In this case, although the voltage of the second gate node NB is in the high level, the second discharge transistor 40 is in the OFF state because the voltage (=0V) between the gate and the source in the second discharge transistor 40 is less than the threshold voltage. That is, the second discharge route DPB is in the deactivated state so that it does not have an influence on a usual power-off operation.

In this way, in the turn-off period PC, the control circuit 100 deactivates the second discharge route DPB whereas the discharge from the first node N1 is carried out through the first discharge route DPA by activating the first discharge route DPA. When the voltage of the first node N1 reduces, the voltage of the output node NZ reduces gradually and becomes 0V finally. At this time, the first node N1 is slowly discharged due to the constant current characteristic of the first discharge transistor 30, and the output transistor 10 is slowly turned off.

2-4. OFF Period PD (Time t4 to t5)

In the OFF period PD, the control circuit 100 sets the first gate node NA to the voltage in the high level and activates the first discharge route DPA. Also, the control circuit 100 sets the second gate node NB and the third node N3 to the voltages in the high level and deactivates the second discharge route DPB.

It should be noted that in the OFF period PD, the voltage of the first node N1 becomes a voltage close to the ground voltage. Therefore, the current does not flow through the second discharge route DPB even if the third node N3 is set to the voltage in the low level. Therefore, the control circuit 100 may set the third node N3 to the voltage in the low level.

2-5. Operation in Case of Occurrence of Load Abnormality (Period PX: Time t6 to t7)

Next, a case that the load abnormality has occurred in the midst of the power-on (for example, load 20 is short-circuited to be fallen to an over-current state) will be considered. When the load abnormality is detected by a detecting circuit (over-current detecting circuit and over-temperature detecting circuit) which is not shown, the control circuit 100 carries out "high-speed discharge" to prevent the destruction of the output transistor 10.

Specifically, the control circuit 100 stops the charging the first node N1. Also, the control circuit 100 sets the first gate node NA to the voltage in the high level and activates the first discharge route DPA. Moreover, the control circuit 100 sets the second gate node NB to the voltage in the high level (VCC) and sets the third node N3 to the voltage in the low level (VCC−6V). In this case, the voltage between the gate and the source in the second discharge transistor 40 exceeds the threshold voltage so that the second discharge transistor 40 is turned on. That is, the second discharge route DPB is activated.

In this way, the control circuit 100 activates both of the first discharge route DPA and the second discharge route DPB to discharge the first node N1 through both of the first discharge route DPA and the second discharge route DPB when the load abnormality has occurred. Therefore, the voltage at the node N1 reduces rapidly, and as a result, the output transistor 10 is turned off at high speed. It should be noted that when the voltage of the second node N2 falls below the forward voltage of the diode 51, the second discharge route DPB is blocked off.

2-6. Operation at Application of Dump Surge

Figure 8:
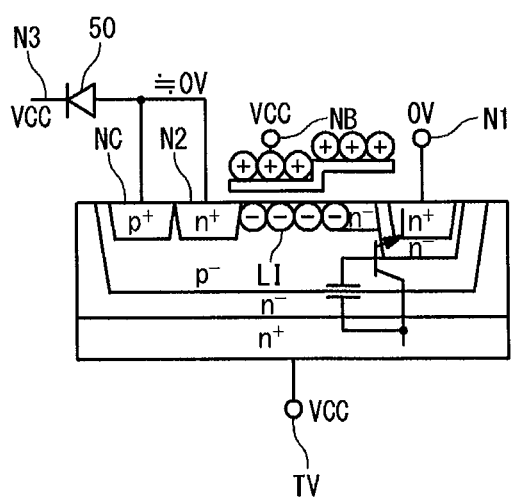
FIG. 8 is a diagram showing an operation and an effect in the embodiment of the present invention.

Next, in the OFF period PD, a case where the steep increase of the power supply voltage VCC occurs due to the application of the dump surge will be considered. In an example shown in FIG. 7, the dump surge is applied to the power supply terminal TV at time t8 in the midst of the OFF period PD. According to the present embodiment, even if the dump surge is applied to the power supply terminal TV in the midst of the OFF period PD, the parasitic bipolar transistor Q1 is not turned on. Referring to FIG. 8, the mechanism will be described.

FIG. 8 shows the conditions of the second discharge transistor 40 and the parasitic bipolar transistor Q1 in the OFF period PD. The collector, the emitter and the base of the parasitic bipolar transistor Q1 are connected with the power supply terminal TV, the first node N1 and the back gate node NC, respectively. Also, the parasitic capacitance (the capacitance between the collector and the base) C1 is connected between the power supply terminal TV and the back gate node NC.

As mentioned above, the voltage (VCC) in the high level is applied to the second gate node NB connected with the gate of the second discharge transistor 40 in the OFF period PD. Therefore, as shown in FIG. 8, in the channel area of the second discharge transistor 40, an "inversion layer LI" is formed. The inversion layer LI short-circuits between the drain (the first node N1) and the source/back gate (the second node N2/the back gate node NC) of the second discharge transistor 40. That is, the inversion layer LI is formed so that the emitter and the base of the parasitic bipolar transistor Q1 are short-circuited.

Therefore, even if the steep increase of the power supply voltage VCC has occurred so that the voltage of the node NC is raised through the parasitic capacitance C1, the parasitic bipolar transistor Q1 is not turned on. Because a large breakdown current never flows, there is no case that the voltage of the first node N1 is raised so that the output transistor 10 is half turned-on. Therefore, heat destruction of the output transistor 10 can be prevented.

As described above, according to the present embodiment, even if the steep increase of the power supply voltage VCC has occurred when the power semiconductor device 1 is in the off condition, it can be prevented that the output transistor 10 is turned on. That is, heat destruction of the output transistor 10 can be prevented.

3. Modification

Figure 9:
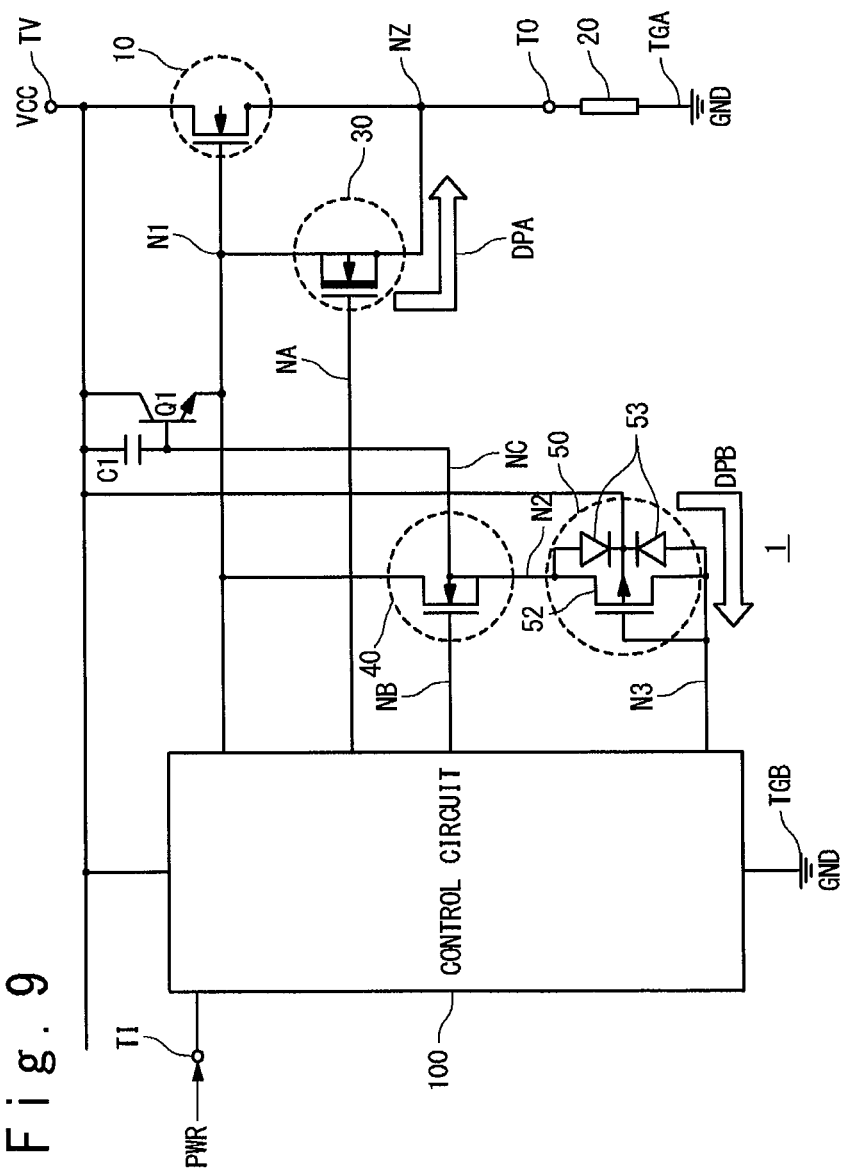
FIG. 9 is a block diagram showing a modification of the power semiconductor device according to the embodiment of the present invention.

FIG. 9 is a block diagram showing a modification of the power semiconductor device 1 according to the present embodiment. In this modification, as the countercurrent prevention device 50, parasitic diodes 53 of a P-channel MOSFET 52 are used instead of the diode 51. A drain, a source and a gate in the P-channel MOSFET 52 are connected with the third node N3, the second node N2 and the third node N3, respectively. Also, the back gate of the P-channel MOSFET 52 is connected with the power supply terminal TV. Thus, as shown in FIG. 9, the parasitic diode 53 is formed between the back gate and the source in the P-channel MOSFET 52.

4. Circuit Configuration Example

Figure 10:
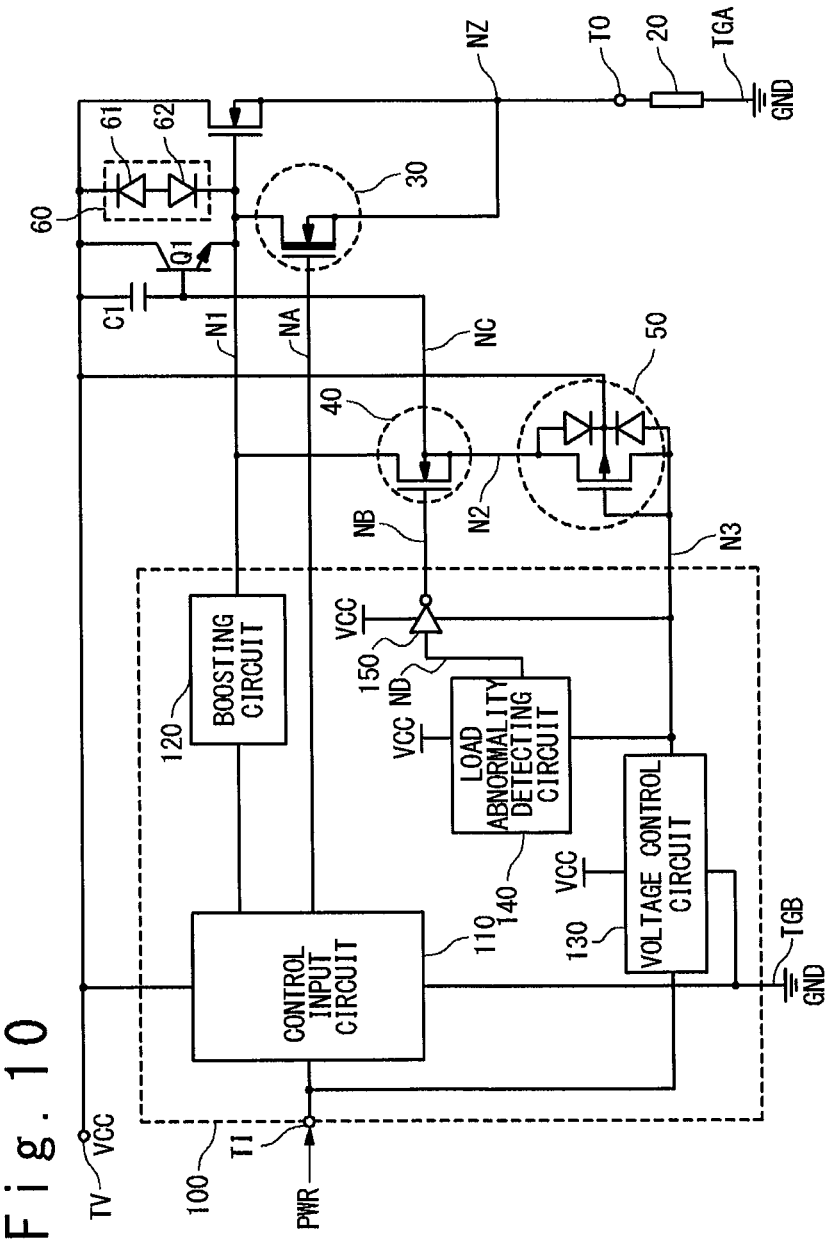
FIG. 10 is a circuit block diagram showing a circuit configuration example of the power semiconductor device according to the embodiment of the present invention.

FIG. 10 shows an example of the circuit configuration of the power semiconductor device 1 according to the present embodiment. The same description as the above description is appropriately omitted.

Moreover, in FIG. 10, an overvoltage protection circuit 60 (a dynamic clamping circuit) is connected between the power supply terminal TV and the first node N1. The overvoltage protection circuit 60 has diodes 61 and 62. The power supply terminal TV is connected with the cathode of the diode 61. The anode of the diode 61 is connected with the anode of diode 62. The cathode of the diode 62 is connected with the first node N1. The overvoltage protection circuit 60 is provided to protect the output transistor 10 from a counter electromotive voltage generated when the load 20 is an inductive load.

The control circuit 100 has a control input circuit 110, a boosting circuit 120, a voltage control circuit 130, a load abnormality detecting circuit 140 and an inverter 150.

The control input circuit 110 controls the voltages of the boosting circuit 120 and the first gate node NA according to the power-on signal PWR. When the power-on signal PWR is activated, (PWR=high level), the control input circuit 110 operates the boosting circuit 120 and also sets the first gate node NA to the voltage in the low level. The boosting circuit 120 charges the first node N1 to a higher voltage than the power supply voltage VCC. On the other hand, when the power-on signal PWR is deactivated (PWR=low level), and when the load abnormality has occurred, the control input circuit 110 stops the boosting circuit 120 and also sets the first gate node NA to the voltage in the high level.

The voltage control circuit 130 is provided between the power supply terminal TV and the ground terminal TGB. Also, the voltage control circuit 130 controls the voltage of the third node N3 in response to the power-on signal PWR. Specifically, when the power-on signal PWR is activated (PWR=High level), the voltage control circuit 130 sets the third node N3 to the voltage in the low level (VCC−6V). On the other hand, when the power-on signal PWR is deactivated (PWR=low level), the voltage control circuit 130 sets the third node N3 to the voltage in the high level (VCC).

The load abnormality detecting circuit 140 is connected between the power supply terminal TV and the third node N3 to respectively use the voltage of the power supply voltage VCC and the voltage of the third node N3 as a positive voltage and a negative voltage. The output terminal of the load abnormality detecting circuit 140 is connected with the node ND. The inverter 150 is connected between the power supply terminal TV and the third node N3 to respectively use the voltage of the power supply voltage VCC and the voltage of the third node N3 as the positive voltage and the negative voltage. The output terminal of the inverter 150 is connected with the second gate node NB.

FIG. 11 is a truth table showing the status of the node ND, the second gate node NB and the third node N3. When the power-on signal PWR is deactivated (PWR=low level), the voltage of the third node N3 is in the high level (VCC). Therefore, the load abnormality detecting circuit 140 outputs the voltage in the high level (VCC) to the node ND and the inverter 150 outputs the voltage in the high level (VCC) to the second gate node NB.

When the power-on signal PWR is activated (PWR=high level), the voltage of the third node N3 is in the low level (VCC−6V). At the time of load normality, the load abnormality detecting circuit 140 outputs the voltage in the high level (VCC) to the node ND and the inverter 150 outputs the voltage in the low level (VCC−6V) to the second gate node NB.

On the other hand, when the load abnormality is detected, the load abnormality detecting circuit 140 outputs the voltage in the low level (VCC−6V) to the node ND and the inverter 150 outputs the voltage in the high level (VCC) to the second gate node NB.

Figure 12:
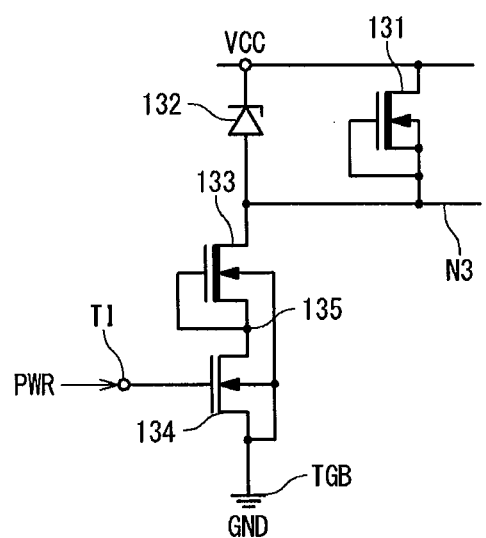
FIG. 12 is a schematically showing a voltage control circuit example of the embodiment of the present invention.

FIG. 12 shows an example of the voltage control circuit 130. The voltage control circuit 130 shown in FIG. 12 has an N-channel MOSFET 131, a zener diode 132, an N-channel MOSFET 133 and an N-channel MOSFET 134.

The N-channel MOSFET 131 functions as a pull-up device for the third node N3. In this example, the N-channel MOSFET 131 is of a depletion type. A drain, a source and a gate of the N-channel MOSFET 131 are connected with the power supply terminal TV, the third node N3 and the third node N3, respectively. The N-channel MOSFET 131 functions as a constant current source.

The anode and the cathode of the zener diode 132 are connected with the third node N3 and the power supply terminal TV, respectively.

The N-channel MOSFET 133 is of the depletion-type, and its drain, source and gate are connected with the third node N3, a node 135 and the node 135, respectively. The N-channel MOSFET 133 functions as a constant current source.

The N-channel MOSFET 134 is of an enhancement type, and its drain, source and gate are connected with the node 135, the ground terminal TGB and the input terminal TI, respectively. The N-channel MOSFET 134 functions as a switch.

When the power-on signal PWR becomes the high level, the N-channel MOSFET 134 is turned on and the voltage of the third node N3 is reduced in the direction of the ground voltage. Then, when the voltage of the third node N3 falls to the voltage lowered from the power supply voltage VCC by the breakdown voltage of the zener diode 132 or more, the current flows through the zener diode 132. As a result, a voltage difference between the power supply terminal TV and the third node N3 is clamped to the breakdown voltage of the zener diode 132. Therefore, when the breakdown voltage of the zener diode 132 is 6 V, the voltage of the third node N3 becomes "VCC−6V".

On the other hand, when the power-on signal PWR becomes the low level, the N-channel MOSFET 134 is turned off. As a result, the voltage of the third node N3 is pulled up to the power supply voltage VCC by the N-channel MOSFET 131.

Figure 13:
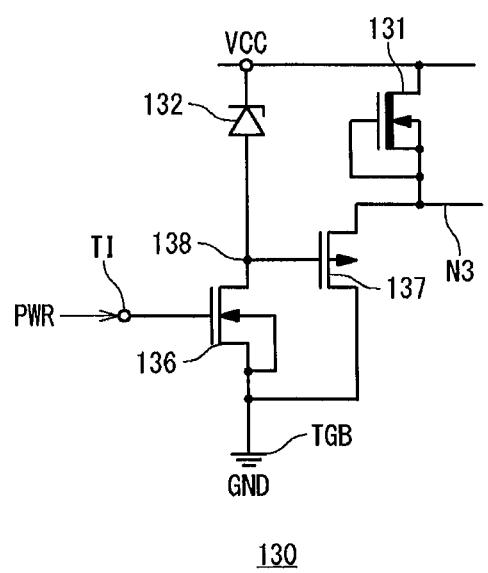
FIG. 13 is a schematically showing a configuration example of the voltage control circuit according to another embodiment of the present invention.

FIG. 13 shows another example of the voltage control circuit 130. The voltage control circuit 130 shown in FIG. 13 has an N-channel MOSFET 131, the zener diode 132, an N-channel MOSFET 136 and a P-channel MOSFET 137.

The N-channel MOSFET 131 functions as a pull-up device for the third node N3. In this example, the N-channel MOSFET 131 is of the depletion-type. A drain, a source and a gate in the N-channel MOSFET 131 are connected with the power supply terminal TV, the third node N3 and the third node N3, respectively. The N-channel MOSFET 131 functions as a constant current source.

The anode and the cathode of the zener diode 132 are connected with a node 138 and the power supply terminal TV, respectively.

The N-channel MOSFET 136 is of an enhancement type, and its drain, source and gate are connected with the node 138, the ground terminal TGB and the input terminal TI, respectively. The N-channel MOSFET 136 functions as a switch.

The P-channel MOSFET 137 is of an enhancement type, and its drain, source and gate are connected with the ground terminal TGB, the third node N3 and the node 138, respectively. The P-channel MOSFET 137 functions as an output buffer.

In case of the configuration shown in FIG. 12, the N-channel MOSFET 133 connected for constant current to flow exists on the route from the third node N3 to the ground terminal TGB. Therefore, the discharge ability of the second discharge route DPB in case of occurrence of load abnormality is limited based on the constant current characteristic of the N-channel MOSFET 133. On the other hand, in case of the configuration shown with FIG. 13, because the P-channel MOSFET 137 is added as the output buffer, the discharge ability of the second discharge route DPB in case occurrence of load abnormality is not under a restriction. That is, the discharge is carried out through the second discharge route DPB at higher speed.

The embodiments of the present invention have been described with reference to the drawings. However, the present invention is not limited to the above-mentioned embodiments and can be appropriately changed by a skilled person in the art in the range which does not deviate from the scope of the present invention.

This patent application claims a priority on convention based on Japanese Patent Application JP 2011-082518 filed on Apr. 4, 2011. The disclosure thereof is incorporated herein by reference.

The invention claimed is:

1. A power semiconductor device comprising:
an output transistor connected between a power supply terminal and an output terminal;
a control circuit configured to control a charging operation and a discharging operation of a first node connected with a gate of the output transistor and control an ON/OFF condition of the output transistor;
a first discharge route from the first node to the output terminal; and
a second discharge route from the first node to a ground terminal,
wherein a period during which the output transistor is in the ON condition stably after the first node is charged is an ON period, and a period during which the output transistor is the OFF condition stably after the first node is an OFF period,
wherein a transition period from the OFF period to the ON period is a turn-on period, and a transition period from the ON period to the OFF period is a turn-off period,
wherein in the turn-on period and the ON period, the control circuit charges the first node, and deactivates the first discharge route and the second discharge route,
wherein in the turn-off period and the OFF period, the control circuit deactivates the second discharge route and activates the first discharge route, and discharges from the first node through the first discharge route,
wherein when a load abnormality has occurred, the control circuit activates both of the first discharge route and the second discharge route to discharge from the first node through both of the said first discharge route and the second discharge route,
wherein the second discharge route comprises:
a discharge transistor having a drain which is connected with the first node, and a source and a back gate which are connected with the second node; and
a countercurrent prevention device connected between the second node and a third node to prevent a flow of current from the third node to the second node,
wherein when the load abnormality has occurred, the control circuit turns on the discharge transistor, and in the OFF period at least, the control circuit sets a gate voltage of the discharge transistor to a high level.

2. The power semiconductor device according to claim 1, wherein in the turn-off period, the control circuit sets a gate voltage of the discharge transistor to the high level, and a voltage between a gate and a source of the discharge transistor to a voltage less than a threshold voltage.

3. The power semiconductor device according to claim 2, wherein in the turn-off period, the control circuit sets the voltage of the third node to the high level which is the same as the gate voltage of the discharge transistor.

4. The power semiconductor device according to claim 1, wherein in the OFF period, the control circuit sets the voltage of the third node to the high level which is the same as the gate voltage of the discharge transistor.

5. The power semiconductor device according to claim 1, wherein when the gate voltage of the discharge transistor is set to the high level, an inversion layer is formed in a channel region of the discharge transistor.

6. The power semiconductor device according to claim 1, wherein the discharge transistor has a parasitic bipolar transistor, and a collector, an emitter and a base of the parasitic bipolar transistor are connected with the power supply terminal, the first node and the back gate of the discharge transistor, respectively.

* * * * *